(12) United States Patent
Matsui

(10) Patent No.: US 7,045,443 B2
(45) Date of Patent: May 16, 2006

(54) METHOD FOR MANUFACTURING SEMICONDUCTOR DEVICE, SEMICONDUCTOR DEVICE, CIRCUIT BOARD, AND ELECTRONIC APPARATUS

(75) Inventor: Kuniyasu Matsui, Hotaka-machi (JP)

(73) Assignee: Seiko Epson Corporation, (JP)

( * ) Notice: Subject to any disclaimer, the term of this patent is extended or adjusted under 35 U.S.C. 154(b) by 114 days.

(21) Appl. No.: 10/744,702

(22) Filed: Dec. 23, 2003

(65) Prior Publication Data

US 2004/0172813 A1    Sep. 9, 2004

(30) Foreign Application Priority Data

Dec. 24, 2002    (JP)    ............................. 2002-371642

(51) Int. Cl.
*H01L 21/44* (2006.01)
*H01L 21/46* (2006.01)
*H01L 23/02* (2006.01)
*H01L 23/48* (2006.01)
*H01L 29/40* (2006.01)

(52) U.S. Cl. ...................... 438/459; 438/108; 438/109; 438/110; 438/455; 438/977; 257/686; 257/697; 257/778

(58) Field of Classification Search ................. 257/777
See application file for complete search history.

(56) References Cited

U.S. PATENT DOCUMENTS

| | | | |
|---|---|---|---|
| 5,172,303 A * | 12/1992 | Bernardoni et al. ......... | 361/744 |
| 5,229,647 A * | 7/1993 | Gnadinger ................... | 257/785 |
| 5,618,752 A * | 4/1997 | Gaul ........................... | 438/626 |
| 5,898,575 A * | 4/1999 | Hawthorne et al. ......... | 361/809 |
| 6,011,301 A * | 1/2000 | Chiu ........................... | 257/678 |
| 6,162,344 A * | 12/2000 | Reid et al. ................... | 205/157 |
| 6,236,115 B1 * | 5/2001 | Gaynes et al. ............... | 257/774 |
| 6,420,209 B1 * | 7/2002 | Siniaguine ................... | 438/108 |
| 6,476,476 B1 * | 11/2002 | Glenn .......................... | 257/686 |
| 6,534,874 B1 * | 3/2003 | Matsumura .................. | 257/777 |
| 6,562,204 B1 * | 5/2003 | Mayer et al. ............. | 204/229.9 |
| 6,566,232 B1 * | 5/2003 | Hara et al. ................... | 438/455 |
| 6,639,303 B1 * | 10/2003 | Siniaguine ................... | 257/621 |
| 6,699,787 B1 * | 3/2004 | Mashino et al. ............. | 438/667 |
| 6,727,116 B1 * | 4/2004 | Poo et al. .................... | 438/106 |
| 6,809,421 B1 * | 10/2004 | Hayasaka et al. ........... | 257/777 |
| 6,830,959 B1 * | 12/2004 | Estacio ........................ | 438/113 |
| 6,903,442 B1 * | 6/2005 | Wood et al. ................. | 257/621 |

(Continued)

FOREIGN PATENT DOCUMENTS

CN    1300526 A    6/2001

(Continued)

OTHER PUBLICATIONS

Communication from Chinese Patent Office regarding a counterpart foreign application.

*Primary Examiner*—Carl Whitehead, Jr.
*Assistant Examiner*—James M. Mitchell
(74) *Attorney, Agent, or Firm*—Harness, Dickey & Pierce, P.L.C.

(57) ABSTRACT

A method is provided for manufacturing a semiconductor device, a semiconductor device, a circuit board, and an electronic apparatus. In such a semiconductor device, semiconductor chips can be readily aligned when they are stacked and terminals can be prevented from being short-circuited, thereby enhancing the reliability of the connection between electrodes of the semiconductor chips. According to the method, semiconductor chips are perforated, and a conductive material such as copper is filled into each perforation, thereby forming a terminal that contains the conductive material and has a recessed portion, disposed in the upper face thereof.

17 Claims, 5 Drawing Sheets

U.S. PATENT DOCUMENTS

| | | | |
|---|---|---|---|
| 2002/0017710 A1* | 2/2002 | Kurashima et al. | 257/686 |
| 2003/0062620 A1* | 4/2003 | Shibata | 257/723 |
| 2003/0094683 A1* | 5/2003 | Poo et al. | 275/686 |
| 2004/0089557 A1* | 5/2004 | Tsuchida et al. | 205/291 |
| 2005/0014311 A1* | 1/2005 | Hayasaka et al. | 438/109 |

FOREIGN PATENT DOCUMENTS

| | | |
|---|---|---|
| EP | 1 110 298 | 5/2001 |
| JP | 2002-170919 | 6/2002 |
| JP | 2003-129285 | 5/2003 |

* cited by examiner

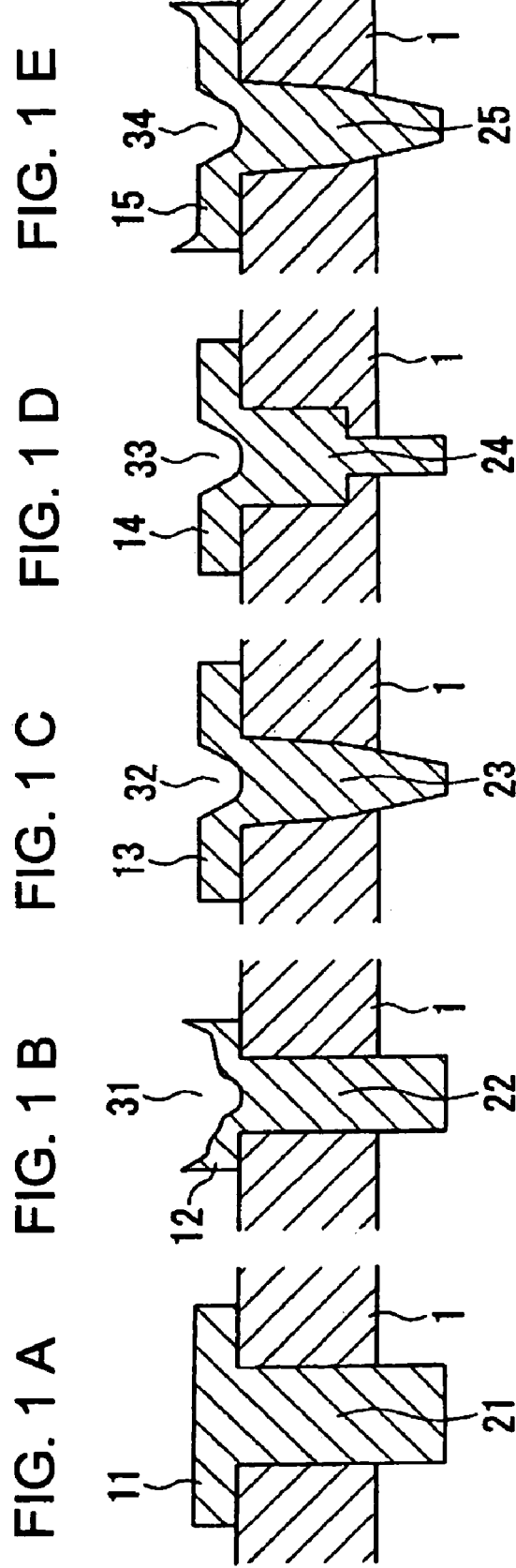

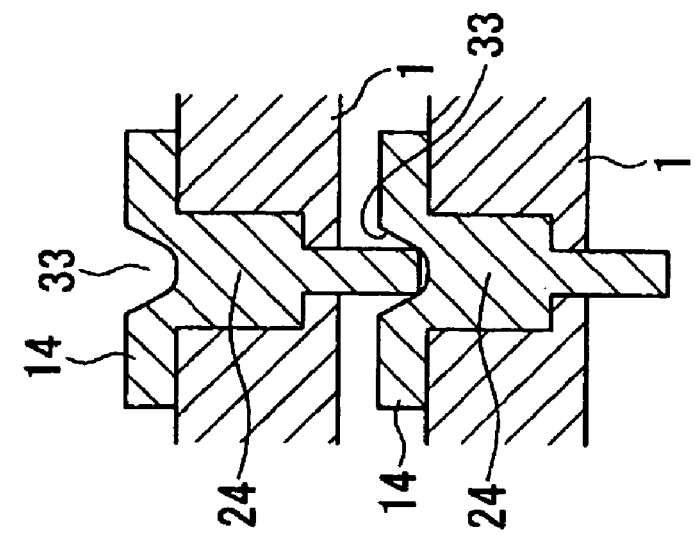
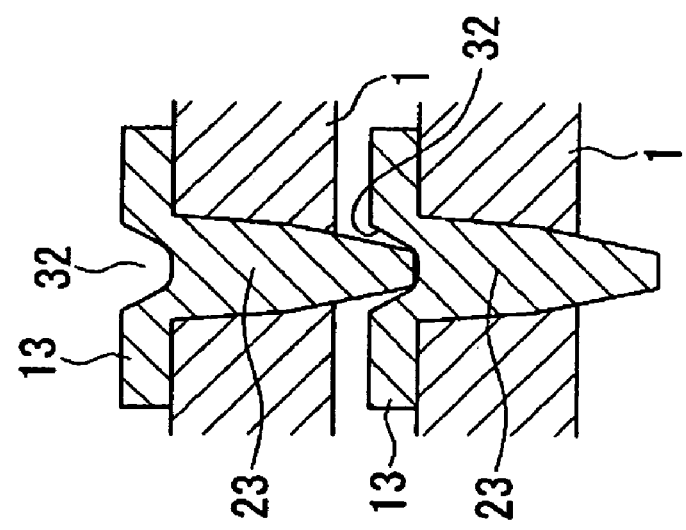
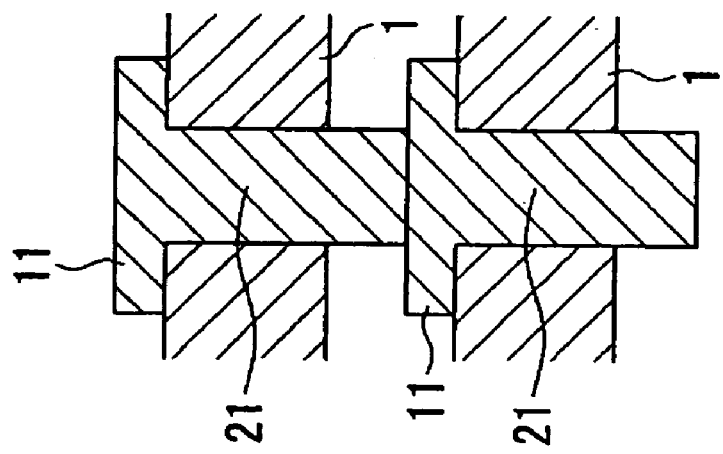

FIG. 3
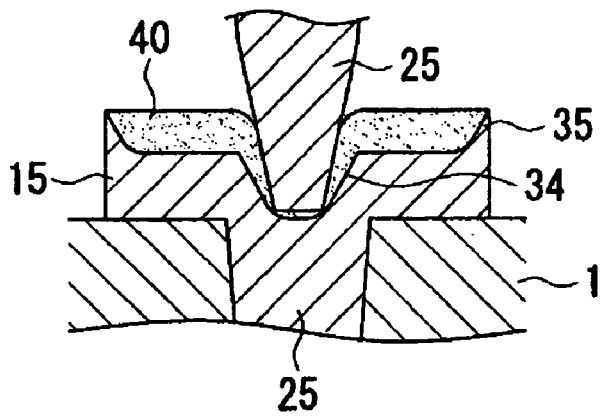
FIG. 4
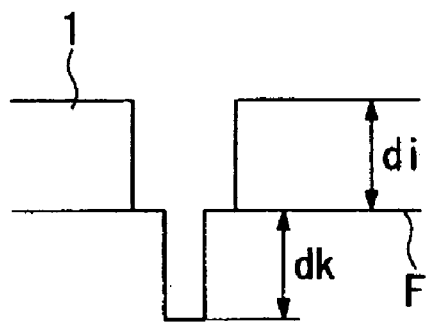
FIG. 5 A    FIG. 5 B
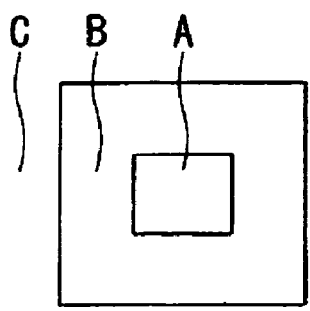 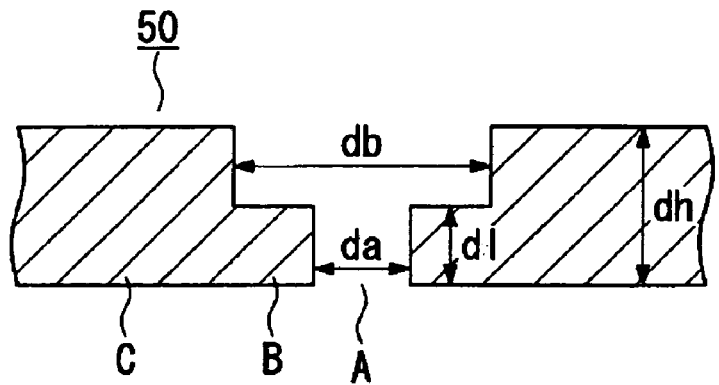

METHOD FOR MANUFACTURING SEMICONDUCTOR DEVICE, SEMICONDUCTOR DEVICE, CIRCUIT BOARD, AND ELECTRONIC APPARATUS

BACKGROUND OF THE INVENTION

1. Technical Field of the Invention

The present invention relates to a method for manufacturing a semiconductor device, a semiconductor device, a circuit board, and an electronic apparatus.

2. Description of the Related Art

At present, in portable electronic apparatuses such as mobile phones, notebook personal computers and PDA (personal data assistants), in order to reduce size and weight, the miniaturization of various electronic components such as internal semiconductor chips has been advancing and therefore spaces on which such electronic components are mounted have been limited.

Therefore, for example, in semiconductor chips, packaging methods thereof have been improved and a micro-packaging method called CSP (Chip Scale Package) has been currently devised. Semiconductor chips manufactured by the CSP technique have a packaging area that is substantially the same as the chip area; hence, high-density mounting can be achieved.

For the above electronic apparatuses, it is presumed that the miniaturization and multi-functionalization further advance; hence, the packaging density of the semiconductor chips must be further increased. In view of the above situation, a technique for three-dimensionally stacking the semiconductor chips has been proposed. The three-dimensional chip-stacking technique is as follows: semiconductor chips having the same function are stacked or semiconductor chips having different functions are stacked, and the semiconductor chips are wired, thereby densely mounting the semiconductor chips (see, for example, Japanese Unexamined Patent Application Publication No. 2002-170919).

In the three-dimensional stacking technique, a method for wiring the semiconductor chips is critical. This is because in order to allow a semiconductor apparatus comprising a plurality of semiconductor chips to exert predetermined functions, the semiconductor chips must be wired according to design and firmly connected to each other so as to achieve the toughness and reliability of the semiconductor chips.

Semiconductor chips used for the three-dimensional chip-stacking technique each include electrodes each disposed on the front face and back face and have a perforation that extends therethrough and has a prism or cylindrical shape. The semiconductor chips have an electrode configuration in which the perforation is filled with a conductive material and the electrodes each disposed on the front face and back face are electrically connected to each other with the conductive material. When the semiconductor chips having such an electrode configuration are stacked, an electrode on the back face of one of the semiconductor chips is connected to an electrode on the front face of another one, whereby the semiconductor chips are wired.

In the method for wiring the semiconductor chips used in the three-dimensional chip-stacking technique, there are some problems. First, yield is low and manufacturing cost is high because it is difficult to align the electrodes of the semiconductor chips precisely when the semiconductor chips are stacked. Secondly, since the conductive material is connected to the electrodes with a solder (brazing alloy) disposed therebetween, the solder is forced out between the conductive material and electrodes, thereby causing troubles such as short circuits between terminals. Thirdly, since the alignment of the electrodes is difficult and a junction of each terminal and the conductive material for connecting the electrodes each disposed on the front face and back face is readily broken, the reliability of the connection between the terminal and conductive material is low.

The present invention has been made in order to solve the above problems. It is an object of the present invention to provide a method for manufacturing a semiconductor device, a semiconductor device, a circuit board, and an electronic apparatus. In such a semiconductor device, semiconductor chips can be readily aligned when they are stacked and terminals can be prevented from being short-circuited, thereby enhancing the reliability of the connection between electrodes of the semiconductor chips.

SUMMARY

In order to achieve the above object, a method for manufacturing a semiconductor device according to the present invention includes the steps of forming a perforation in a first semiconductor chip and filling a conductive material into the perforation to form a first terminal having a recessed portion in the upper face thereof.

According to the present invention, when a plurality of semiconductor chips having the same configuration as that of the first semiconductor chip are stacked, terminals that are placed in corresponding perforations and contain the conductive material can be used for wiring the semiconductor chips. The semiconductor chips can be wired and three-dimensionally mounted by arranging the semiconductor chips in such a manner that, for example, a protrusive portion of the terminal of one semiconductor chip is placed in the recessed portion in the upper face of the terminal of another semiconductor chip. Thus, according to the present invention, when a plurality of the semiconductor chips having the same configuration as that of the first semiconductor chip are stacked and then wired, the semiconductor chips can be readily aligned and high wiring reliability can be obtained.

In the method for manufacturing a semiconductor device according to the present invention, the step of filling the conductive material is preferably performed by subjecting the perforation to a plating operation.

According to the present invention, when the perforation is subjected to the plating operation, the conductive material for forming the first terminal is deposited on the bottom portion and wall of the perforation with a cone-shaped hollow left on the top of the deposited conductive material. Thus, the recessed portion of the first terminal, used for connecting semiconductor chips, containing the conductive material can be readily formed and voids are prevented from being formed, thereby reducing manufacturing cost and time.

In the method for manufacturing a semiconductor device according to the present invention, the step of filling the conductive material is preferably performed by subjecting the perforation to a plating operation and the recessed portion is preferably formed by controlling the time or intensity of the plating operation.

According to the present invention, the perforation is subjected to the plating operation, whereby the conductive material is deposited in the perforation with a cone-shaped hollow left on the top of the deposited conductive material. Thus, the depth and volume of the recessed portion of the first terminal containing the conductive material can be readily adjusted by controlling the time or intensity (current density or the like) of the plating operation, thereby further reducing manufacturing cost and time.

In the method for manufacturing a semiconductor device according to the present invention, the plating operation is preferably performed in such a manner that the density of an applied current is increased from a small value step by step.

According to the present invention, since the current density is increased from a small value step by step, the shape of the conductive material deposited in the perforation can be readily controlled and the perforation can be filled with the conductive material without forming voids.

In the method for manufacturing a semiconductor device according to the present invention, the plating operation is preferably performed in such a manner that the current density is increased from 0.2–0.5 A/dm$^2$ to 0.5–1 A/dm$^2$, 1–2 A/dm$^2$, and then 2–3 A/dm$^2$ by four steps.

According to the present invention, since the density of applied current is increased from 0.2–0.5 A/dm$^2$ to 0.5–1 A/dm$^2$, 1–2 A/dm$^2$, and then 2–3 A/dm$^2$ by four steps, the perforation can be uniformly filled with the conductive material without forming voids.

In the method for manufacturing a semiconductor device according to the present invention, the plating operation is preferably performed in such a manner that an additive is added to a plating solution a certain amount at a time during the plating operation.

According to the present invention, since the additive is not added all at once but is added a certain amount at a time, the rate of forming a metal coating is largest when the metal coating is formed at the bottom of the perforation; hence, the metal coating formed by the plating operation can be grown in the perforation with a cone-shaped hollow left on the metal coating.

The method for manufacturing a semiconductor device according to the present invention preferably further includes the steps of shaving a face of the first semiconductor chip to expose the bottom end of the first terminal from the shaved face; preparing a second semiconductor chip equipped with a second terminal having the same structure as that of the first terminal; and stacking the first and second semiconductor chips such that the bottom end of the first terminal is in contact with the recessed portion in the upper face of the second terminal of the second semiconductor chip.

According to the present invention, since the first and second semiconductor chips are stacked such that the bottom end of the first terminal extending through the first semiconductor chip is in contact with the recessed portion in the upper face of the second terminal extending through the second semiconductor chip, the first and second semiconductor chips to be stacked and wired can be readily aligned and the wiring reliability can be enhanced.

Furthermore, according to the present invention, since the alignment for the wiring connection is simple, terminals and wiring lines can be arranged in a fine pitch.

In the method for manufacturing a semiconductor device according to the present invention, at least one of the first and second terminals preferably has a T shape in cross section and the recessed portion is located at substantially the center of the upper face of the terminal having such a T shape.

According to the present invention, since the first terminal or second terminal has a T shape in cross section, the recessed portion having the following bottom area can be readily formed in the upper face of the first terminal or second terminal: a bottom area larger than the area of the bottom end of the terminal having such a T shape. Thus, the first and second semiconductor chips to be stacked and wired can be readily aligned and the wiring reliability can be enhanced.

In the method for manufacturing a semiconductor device according to the present invention, at least one of the first and second terminals preferably has a circular shape in cross section perpendicular to an axis between the upper face and bottom end of the terminal.

According to the present invention, since one of the first and second terminals has a circular shape in cross section perpendicular to the terminal axis, the surface shape of the recessed portion can be readily controlled.

In the method for manufacturing a semiconductor device according to the present invention, the upper face of at least one of the first and second terminals preferably has a diameter that is two times larger than the diameter of the bottom end of the terminal and smaller than or equal to five times the diameter thereof.

According to the present invention, since the diameter of the upper face of one of the first and second terminals is two times larger than the diameter of the bottom end of the terminal and smaller than or equal to five times the diameter thereof, the surface shape of the recessed portion can be readily controlled.

In the method for manufacturing a semiconductor device according to the present invention, the perforation preferably extends through a conductive pad disposed on at least one of the first and second semiconductor chips.

According to the present invention, since the conductive pad is connected to the first terminal or second terminal in such a manner that the first terminal or second terminal extends through the conductive pad, used for wiring semiconductor chips, containing aluminum or the like, a plurality of semiconductor chips can be readily wired.

In the method for manufacturing a semiconductor device according to the present invention, it is preferable that the bottom portion of the perforation has a tapered shape and the bottom end of at least one of the first and second terminals has a tapered shape.

According to the present invention, the bottom end of the first terminal of the first semiconductor chip can be readily placed in the recessed portion of the second terminal of the second semiconductor chip. Therefore, the first and second semiconductor chips to be stacked and wired can be readily aligned and the wiring reliability can be further enhanced.

In the method for manufacturing a semiconductor device according to the present invention, it is preferable that the bottom portion of the perforation has a tapered shape, the wall of the bottom portion thereof has a step, the bottom end of at least one of the first and second terminals has a tapered shape, and the surface of the bottom end thereof has a step.

According to the present invention, since the bottom end of the first terminal or second terminal is tapered and has a step, the bottom end of one of the first and second terminals can be more readily placed in the recessed portion of the other.

In the method for manufacturing a semiconductor device according to the present invention, it is preferable that the bottom portion of the perforation has a tapered shape, the wall of the bottom portion thereof has a plurality of steps, the bottom end of at least one of the first and second terminals has a tapered shape, and the surface of the bottom end thereof has a plurality of steps.

According to the present invention, the bottom end of one of the first and second terminals can be more readily placed in the recessed portion of the other.

The method for manufacturing a semiconductor device according to the present invention preferably further includes a step of placing a brazing alloy on at least one of the upper face and bottom end of at least one of the first and second terminals and then joining the first and second semiconductor chips each other with the brazing alloy disposed therebetween.

According to the present invention, since the first and second terminals can be firmly joined to each other with the brazing alloy disposed therebetween and the brazing alloy can be retained in the recessed portion of the terminal upper face, the brazing alloy can be prevented from being forced out and therefore the terminals can be prevented from being short-circuited; hence, the wiring reliability can be enhanced. The brazing alloy is preferably formed by a plating process and may be formed by a printing process or application process.

The method for manufacturing a semiconductor device according to the present invention preferably further includes a step of placing a brazing alloy on a region of the upper face of at least one of the first and second terminals and then joining the first and second semiconductor chips each other with the brazing alloy disposed therebetween, wherein the region is one other than the edge of the upper face.

According to the present invention, since the brazing alloy is not placed at the edge of the upper face of the first terminal or second terminal, the brazing alloy can be prevented from being forced out of the upper face when the first and second terminals are joined to each other; hence, the wiring reliability can be further enhanced.

The method for manufacturing a semiconductor device according to the present invention preferably further includes a step of placing a brazing alloy on the recessed portion of at least one of the first and second terminals and then joining the first and second semiconductor chips each other with the brazing alloy disposed therebetween.

According to the present invention, since the brazing alloy is placed only on the recessed portion of the upper face of the first terminal or second terminal, the brazing alloy can be prevented from being forced out of the upper face when the first and second terminals are joined to each other; hence, the wiring reliability can be further enhanced.

In the method for manufacturing a semiconductor device according to the present invention, the brazing alloy preferably contains at least one selected from the group consisting of Su, Au, Ag, In, SnAg, SnBi, SnCu, SnPb, SnAu, and SnIn.

According to the present invention, the first and second terminals can be firmly joined to each other, and thus the wiring reliability can be further enhanced.

A semiconductor device of the present invention is manufactured by the semiconductor device-manufacturing method described above.

According to the present invention, when the semiconductor device including a plurality of three-dimensionally mounted semiconductor chips stacked and then wired is manufactured, the semiconductor chips can be readily aligned during the stacking thereof. The semiconductor device has no short circuits between the terminals because the brazing alloy is not forced out, has high connection reliability, and can cope with fine pitch wiring.

A circuit board of the present invention includes the semiconductor device described above.

According to the present invention, the circuit board has high mounting density and no short circuits between the terminals and hardly suffers from any problems.

An electronic apparatus of the present invention includes the semiconductor device described above.

According to the present invention, the electronic apparatus can be reduced in size, has high operating speed because elements are densely arranged, and hardly suffers from any problems.

BRIEF DESCRIPTION OF THE DRAWINGS

FIGS. 1A–1E are sectional views showing terminals according to an embodiment of the present invention.

FIGS. 2A–2c are sectional views showing stacked semiconductor chips including the terminals.

FIG. 3 is a sectional view showing the terminals joined to each other with a solder placed on the upper faces of the terminals.

FIG. 4 is a sectional view showing a perforation extending through a semiconductor chip.

FIGS. 5A and 5B are illustrations showing a mask used for forming the perforation.

DETAILED DESCRIPTION

Figure 6:
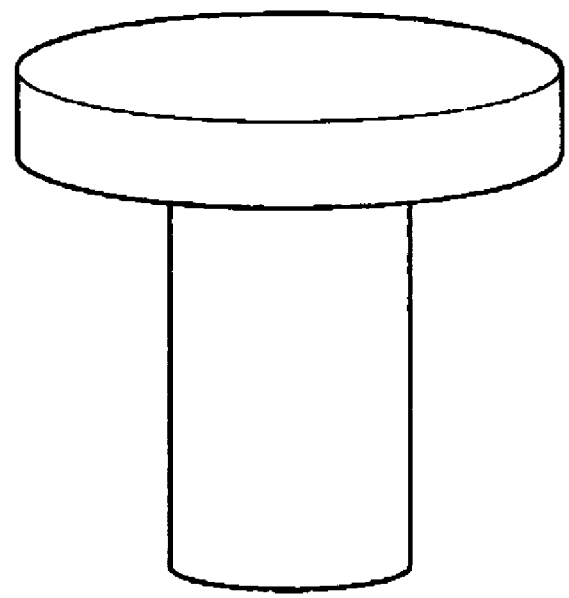
FIG. 6 is a perspective view showing a terminal according to another embodiment of the present invention.

A method for manufacturing a semiconductor device according to an embodiment of the present invention will now be described with reference to the accompanying drawings.

FIG. 1 is a sectional view showing terminals that are components of the semiconductor device according to one embodiment of the present invention. The terminals (first terminals and second terminals) shown in FIG. 1 are manufactured by the manufacturing method according to this embodiment of the present invention. FIGS. 1(a) to 1(e) show five types of terminals. A method for manufacturing the terminals will now be outlined.

Semiconductor chips (a first semiconductor chip and second semiconductor chip) 1 are perforated and a conductive material is then filled into the perforations, whereby the terminals having a T shape in cross section are formed. The bottom faces of the semiconductor chips 1 are shaved such that bottom ends of the terminals are exposed, thereby forming the terminals each extending through the corresponding semiconductor chips 1 as shown in FIGS. 1A to 1E.

The terminals each include corresponding posts 11, 12, 13, 14, and 15 each protruding from the upper faces of the corresponding semiconductor chips 1, portions each extending through the corresponding semiconductor chips 1, and plugs 21, 22, 23, 24, and 25 protruding from the lower faces of the corresponding semiconductor chips 1.

A plurality of the semiconductor chips 1 including terminals similar to those shown in FIGS. 1A to 1E are prepared. The semiconductor chips 1 are then stacked as shown in FIG. 2. FIG. 2 is a sectional view showing the stacked semiconductor chips 1 including the terminals shown in FIGS. 1A, 1C, or 1D. The semiconductor chips 1 each include the corresponding terminals. The terminals are arranged such that the bottom ends of the plugs 21, 22, 23, 24, and 25 of the terminals belonging to one group of the semiconductor chips 1 (first terminals) are each in contact with the upper faces of the corresponding posts 11, 12, 13, 14, and 15 of the terminals belonging to the other group of the semiconductor chips 1 (second terminals) when the semiconductor chips 1 are stacked.

Thus, as shown in FIGS. 1A to 1E and FIGS. 2A to 2C, the use of the terminals having a T shape in cross section enhances the tolerance of the alignment of the semiconductor chips 1 that are stacked and wired.

The terminals shown in FIGS. 1B to 1E have recessed portions 31, 32, 33, and 34 each disposed at substantially the center regions of the upper faces of the corresponding posts 12, 13, 14, and 15.

Therefore, the bottom ends of the plugs 22, 23, 24, and 25 of the terminals belonging to one group of the semiconductor chips 1 (first terminals) can be each readily placed into the recessed portions 31, 32, 33, and 34 in the upper faces of the corresponding posts 12, 13, 14, and 15 of the terminals belonging to the other group of the semiconductor chips 1 (second terminals) when the semiconductor chips 1 are stacked. Furthermore, the terminals are firmly joined to each other, thereby enhancing the reliability of connection.

In the terminals shown in FIGS. 1C to 1E, the bottom ends of the plugs 23, 24, and 25 protrude and have a pointed shape. The plugs 23 and 25 of the terminals shown in FIGS. 1C and 1E, respectively, are tapered off from the post side toward the bottom end side. The plug 24 of the terminal shown in FIG. 1D is tapered off and has a step on the surface. The plug 24 may have a plurality of steps. With reference to FIG. 1D, only the thinnest portion protrudes from the bottom face; however, a thicker portion may protrude therefrom.

As described above, since the bottom ends of the plugs 23, 24, and 25 protrude and have a pointed shape, the plugs 23, 24, and 25 of the terminals belonging to one group of the semiconductor chips 1 are each more readily placed into the recessed portions 32, 33, and 34 of the corresponding posts 13, 14, and 15 of the terminals belonging to the other group of the semiconductor chips 1. Since the plugs 23, 24, and 25 of one group of the terminals are each located at substantially the center regions of the recessed portions 32, 33, and 34 of the corresponding posts 13, 14, and 15 belonging to the other group of the terminals, the alignment accuracy can be automatically improved in a stacking step.

In the plug 22 of the terminal shown in FIG. 1B, the bottom end does not have a sharp shape; hence, the recessed portion 31 is wider than the recessed portions 32, 33, and 34 of the other terminals.

A solder (brazing alloy) is preferably placed on the upper face of the posts 11, 12, 13, 14, and 15 in a step performed before a step of stacking the semiconductor chips 1 as shown in FIG. 2. FIG. 3 is a sectional view showing the terminals, shown in FIG. 1E, joined to each other with a solder 40 placed on the upper face of the post 15. A protrusion 35 protruding upward lies at the edge of the upper face of the post 15 shown in FIGS. 1E and 3. The upper face of the post 15 is recessed and has a step on the surface.

The bottom end of the plug 25 of one terminal is placed into the deepest region of the recessed portion 34 of another terminal.

According to the above configuration, the solder 40 can be prevented from being forced out of the upper face of the post 15. Thus, the terminals can be prevented from being short-circuited even if the distance between the terminals is narrow.

The solder 40 may be placed on the bottom end of each plug 25 instead of the upper face of each post 15. The solder 40 may be placed on both the upper face of the post 15 and the bottom end of the plug 25.

For the terminals having the posts 11, shown in FIG. 1A, having the flat upper faces, the solder 40 can be prevented from being forced out of the upper faces of the posts 11 by placing the solder 40 at a region inside the edge of the upper face of each post 11 when the terminals are joined to each other.

For the terminals shown in FIGS. 1B to 1E, the solder 40 can be prevented from being forced out of the upper faces of the posts 12, 13, 14, and 15 by placing the solder 40 only in the recessed portions 31, 32, 33, and 34 of the posts 12, 13, 14, and 15 when the terminals are joined to each other.

The solder 40 for connecting the terminals each other preferably contains at least one selected from the group consisting of Sn (tin), Au (gold), Ag (silver), In (indium), SnAg (tin-silver alloy), SnBi (tin-bismuth alloy), SnCu (tin-copper alloy), SnPb (tin-lead alloy), SnAu (tin-gold alloy), and SnIn (tin-indium alloy). Thereby, the terminals placed in the semiconductor chips 1 can be securely connected to each other and the wiring reliability can be enhanced while wiring lines are densely arranged.

A method for manufacturing a semiconductor device including each terminal described above will now be described in detail. FIG. 4 is a sectional view showing each perforation extending through each semiconductor chip 1. FIG. 5 is an illustration showing a mask, placed on the upper face of the semiconductor chip 1, for forming the perforation shown in FIG. 4. FIG. 5A is a plan view of the mask and FIG. 5B is a sectional view thereof.

As shown in FIG. 4, a face of the semiconductor chip 1 is perforated. The perforation shown in FIG. 4 is used for forming the terminal shown in FIG. 1D, and perforations used for forming the terminals shown in FIG. 1A, 1B, 1C, and 1E can be formed according to the same procedure as that described below. Each perforation has, for example, a prism shape and may have a cylindrical shape.

The perforation has a width of, for example, 10–50 μm in cross section. For example, the perforation shown in FIG. 4 has a narrow portion close to the bottom face and a wide portion close to the upper face, wherein the narrow portion has a width of 10 μm in cross section and the wide portion has a width of 30 μm in cross section. The perforation has a depth of, for example, about 80 μm. In FIG. 4, the narrow portion close to the bottom face has a length dk of 20 μm and the wide portion close to the upper face has a length di of 60 μm.

In order to form the above perforation, the mask 50 shown in FIG. 5 is placed on the upper face of each semiconductor chip 1, thereby performing an etching operation. The semiconductor chip 1 used herein contains, for example, silicon. The perforation is preferably formed at, for example, substantially the center of an aluminum pad placed on the surface of the semiconductor chip 1. The aluminum pad is electrically connected to each terminal described above and they form part of wiring members of a semiconductor device.

When the semiconductor chip 1 is perforated, the semiconductor chip 1 may include a plurality of semiconductor devices, aluminum pads, wiring lines, and the like or may not include such semiconductor devices, aluminum pads, and wiring lines. A silicon wafer to be cut into chips may be used instead of the semiconductor chip 1.

With reference to FIG. 5, the mask 50 has a ring shape in which the hollow portion has a rectangular parallelepiped shape and the wall of the hollow portion has a step. The mask 50 has a through hole A located at the center and includes an engraved portion B surrounding the through hole A and an outer portion C surrounding the engraved portion B. The through hole A has a width da of about 10 μm in cross section, and the engraved portion B has a width db of about 30 μm in cross section. The through hole A has a height dl of about 0.5 μm, and the outer portion C of the mask 50 has a thickness dh of about 2 μm. The through hole A and engraved portion B may have a circular shape when viewed from above, while they have the cross-sectional shape shown in FIG. 5B.

A procedure of preparing the mask 50 having the above shape is as follows: a $SiO_2$ thin-film having a thickness of 2 μm is formed on the upper face of the semiconductor chip 1, and the $SiO_2$ thin-film is then etched, whereby the through hole A and engraved portion B shown in FIG. 5 are formed in that order. In this procedure, the engraved portion B may be formed by a half-etching process and the through hole A may be then formed. The forming method thereof is not limited. A resist layer may be used instead of the $SiO_2$ thin-film. The etching process includes a wet etching process and dry etching process. The dry etching process includes a reactive ion etching (RIE) process.

After the mask 50 shown in FIG. 5 is provided on the semiconductor chip 1 according to the above procedure, the resulting semiconductor chip 1 containing silicon is then dry-etched. In this etching operation, the reactive ion etching (RIE) process may be used. A wet etching process may be used instead of a dry etching process. In the etching operation, when the semiconductor chip 1 containing silicon is etched, the mask 50 containing $SiO_2$ is also slightly etched, that is, $SiO_2$ is slightly etched as compared with silicon.

The engraved portion B of the mask 50 containing $SiO_2$ is etched and then removed while a portion of the semiconductor chip 1 under the through hole A of the mask 50 is etched by several tens of μm.

In this etching operation, when, for example, the selective ratio of silicon to $SiO_2$ is 45, the etching rate of silicon is 30 μm/min, and the engraved portion B of the mask 50 has a thickness of 0.44 μm, the portion of the semiconductor chip 1 under the through hole A is etched by 20 μm and the engraved portion B is removed after about 40 seconds since the etching operation has been started.

The etching operation is further continued, whereby a portion of the semiconductor chip 1 under the removed engraved portion B is etched. After about two minutes since the etching of the portion under the removed engraved portion B has been started, this portion is etched by 60 μm, thereby forming the perforation shown in FIG. 4.

The length dk of the narrow portion of the perforation close to the bottom face and the length di of the wide portion thereof close to the upper face can be adjusted by controlling the thickness dh of the mask 50 and the depth of the engraved portion B (or the height di of the through hole A). The length dk of the narrow portion close to the bottom face is preferably smaller than the length di of the wide portion close to the upper face.

Since the mask 50 has a ring shape and the hollow portion thereof has a tapered shape in cross section, that is, since the wall of the hollow portion is sloped, each perforation for forming each terminal shown in FIG. 1C or 1E can be formed in the semiconductor chip 1. In order to form the perforation for forming the terminal shown in FIG. 1C or 1E, that is, the perforation which becomes narrower toward the bottom thereof, the following method may be used: a ring-shaped mask having a vertical inner wall is used and the flow of a dry etching gas supplied to the hollow portion of the mask is controlled.

After the perforation shown in FIG. 4 is formed according to the above procedure, a base layer (not shown) is formed over the electrode pad and the inner wall of the perforation. The base layer is used for forming each terminal shown in FIG. 1 by plating the electrode pad and the inner wall of the perforation. The base layer includes, for example, a barrier sub-layer and seed sub-layer disposed thereon. The barrier sub-layer contains TiW or TiN and the seed sub-layer contains Cu. These sub-layers are formed by a sputtering process, an ion metal plasma (IMP) process, a vacuum vapor deposition process such as a physical vapor deposition (PVD) process or chemical vapor deposition (CVD) process, or an electroless plating process such as an ion plating process. The barrier sub-layer and seed sub-layer are formed over a wafer and unnecessary portions of the sub-layers are removed by an etching process in the final preparing step. The barrier sub-layer has a thickness of about 100 nm and the seed sub-layer has a thickness ranging from several hundreds to 1000 nm.

After the base layer is formed over the electrode pad and the inner wall of the perforation, the electrode pad and the inner wall of the perforation are plated, thereby forming each terminal shown in FIG. 1. A particular procedure of the plating operation is described below. Patterning is performed on the semiconductor chip 1 such that a region for forming the terminal is exposed and the other region is covered with, for example, a resist material. The resist material includes a liquid resist material and dry film. Copper is gradually deposited over the electrode pad and the bottom and inner wall of the perforation by, for example, an electrochemical plating (ECP) process.

In the plating procedure, an additive for bottom-up filling is preferably added to a plating solution at a constant amount in a predetermined time interval (for example, a time interval of ten minutes) during the plating operation. The additive includes, for example, an additive for a copper sulfate plating solution for damascene processes and an additive for a via-filling plating solution for PWBs which are commercially available. In the procedure, a step plating process in which a current with an extremely small density is applied in an initial step and the current density is gradually increased is preferably employed. For example, currents are applied as follows: a current with a density of 0.2 $A/dm^2$ (hereinafter referred to as ASD) is applied for 20 minutes, a current with density of 0.5 ASD is applied for 20 minutes, a current with density of 1.5 ASD is applied for 20 minutes, and a current with density of 3 ASD is then applied for 20 minutes. Since the step plating process is used, copper is deposited in the perforation with a cone-shaped hollow left on the top of the deposited copper, whereby the depth of the perforation is gradually decreased. The plating operation is terminated when the depth of the cone-shaped hollow of the deposited copper becomes the same as that of the recessed portions 31, 32, 33, and 34 shown in FIG. 1. Thereby, the following terminals are formed: the terminals, shown in FIGS. 1B to 1E, each having the corresponding posts 12, 13, 14, and 15 each having the corresponding recessed portions 31, 32, 33, and 34 disposed at substantially the center regions of the posts.

Thus, the shape of the recessed portion of each terminal can be readily varied by controlling the time of the plating operation or the plating intensity such as the current density of the plating operation. In particular, the perforation can be uniformly filled with copper without forming voids by applying a current with a small density, for example, a current with a density of 1 ASD or less, preferably a current with a density of less than 0.5 ASD, in an initial step of applying a current.

When a mask having the through hole A and engraved portion B with a circular shape when viewed from above is used, etching is performed according to the shape of the through hole A of the mask and therefore an obtained perforation of the semiconductor chip 1 has substantially a circular shape when viewed from above. When such a perforation is subjected to plating, a terminal having a circular shape in cross section perpendicular to the axis of the terminal is formed in the perforation. Thus, substantially the center region of the upper face of each post has a cylindrical shape and therefore the surface shape of the post can be readily controlled.

When the upper face of the post has a diameter that is two times larger than the diameter of each plug and smaller than or equal to five times the diameter thereof, the surface shape of the post can be readily controlled.

When the plating operation has been completed, the bottom end of the terminal is placed in the semiconductor chip 1 in an embedded manner. Therefore, the bottom face of the semiconductor chip 1 (wafer) is polished such that the bottom end of the terminal formed by the plating operation is exposed from the bottom face of the semiconductor chip 1, as shown in FIG. 1. This polishing operation is performed until imaginary plane F shown in FIG. 4 appears. In this operation, back-side grinding is performed until the top of the bottom end of the terminal appears, and only the semiconductor chip 1 is then etched by a dry etching process (an RIE process or the like) or wet etching process so as not to etch the terminal, thereby exposing the terminal.

According to the above procedure, one of the terminals shown in FIGS. 1B to 1E is formed in the semiconductor chip 1. A plurality of the semiconductor chips 1 each including the corresponding terminals are manufactured and then stacked as shown in FIG. 2, thereby obtaining a three-dimensionally mounted (stacked) semiconductor device in which high-density mounting is possible.

Since the three-dimensionally mounted semiconductor device is manufactured by the semiconductor device-manufacturing method of this embodiment, the semiconductor chips 1 can be readily aligned each other while the semiconductor chips 1 are stacked. Therefore, the semiconductor device has no short circuits between the terminals because a solder is not forced out, has high connection reliability, and can cope with fine pitch wiring.

In a circuit board having the semiconductor device mounted thereon, the mounting density is high, a short circuit rarely occurs between the terminals, and problems hardly occur.

A terminal according to another embodiment of that shown in FIG.1 will now be described with reference to FIG. 6. FIG. 6 is a perspective view showing the terminal that is a component of a semiconductor device according to an embodiment of the present invention. The terminal shown in FIG. 6 corresponds to the terminals shown in FIGS. 1A to 1E. The terminal shown in FIG. 6 has a cylindrical post and a cylindrical plug. The post has a diameter that is two times larger than the diameter of the plug and smaller than or equal to five times the diameter thereof.

Electronic Apparatus

An example of an electronic apparatus including the semiconductor device manufactured by the method of the above embodiment will now be described.

Figure 7:
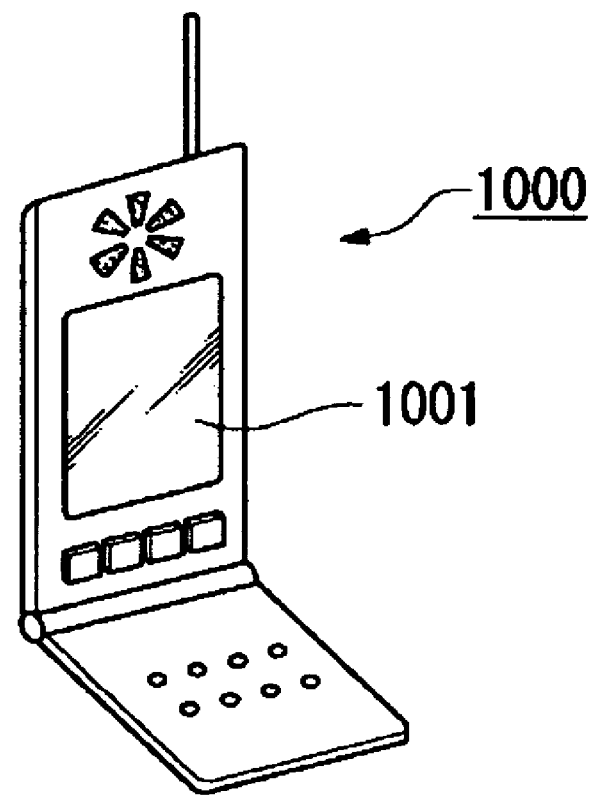
FIG. 7 is a perspective view showing an example of a mobile phone.

FIG. 7 is a perspective view showing an example of a mobile phone. In FIG. 7, reference numeral 1000 represents the body of the mobile phone including the above semiconductor device and reference numeral 1001 represents a display section including the above semiconductor device.

Figure 8:
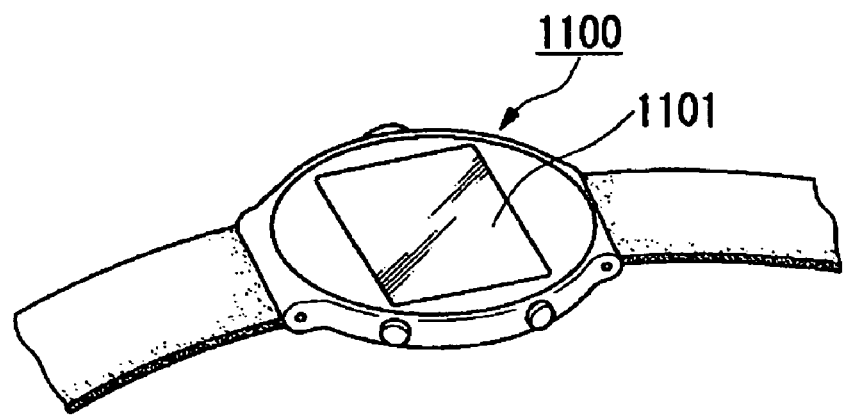
FIG. 8 is a perspective view showing an example of an electronic apparatus, which is of a wrist watch type.

FIG. 8 is a perspective view showing an example of an electronic apparatus, which is of a wrist watch type. In FIG. 8, reference numeral 1100 represents the body of a watch including the above semiconductor device and reference numeral 1101 represents a display section including the above semiconductor device.

Figure 9:
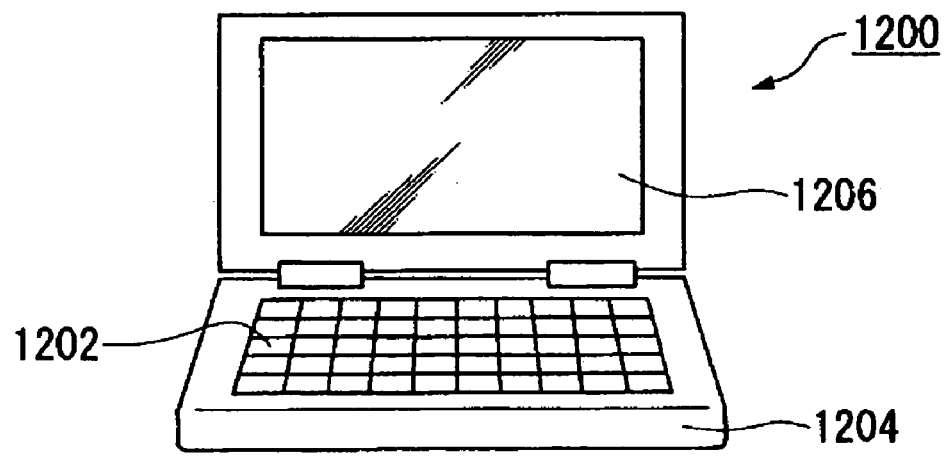
FIG. 9 is a perspective view showing an example of a portable information processing unit.

FIG. 9 is a perspective view showing an example of a portable information processing unit such as a word processor or personal computer. In FIG. 9, reference numeral 1200 represents the information processing unit, reference numeral 1202 represents an input section such as a keyboard, reference numeral 1204 represents the body of the information processing unit including the above semiconductor device, and reference numeral 1206 represents a display section including the above semiconductor device.

Since the electronic apparatuses shown in FIGS. 7 to 9 include the semiconductor device of the embodiment described above, the electronic apparatuses can be readily reduced in size. Furthermore, in the electronic apparatuses, operating performance can be improved and the incidence of problems can be reduced, because elements can be densely arranged in the apparatuses although the apparatuses have substantially the same size as that of known ones.

The present invention is not limited to the above embodiments, and various modifications may be performed within the scope of the present invention. Particular materials and layer configurations described in the above embodiments are only examples and may be modified according to needs.

Advantages

As described above, according to the present invention, the conductive material placed in the perforation of each semiconductor chip has a recessed portion in the upper face, the semiconductor chips can be readily aligned with each other when they are stacked. Thus, a short circuit can be prevented from occurring between the terminals, thereby enhancing the reliability in connection between the electrodes of the semiconductor chips.

The entire disclosure of Japanese Patent Application No. 2002-371642 filed Dec. 24, 2002 is incorporated by reference.

What is claimed is:

1. A method for manufacturing a semiconductor device, comprising the steps of:
   forming a perforation in an upper surface of a first semiconductor chip;
   filling a conductive material into the perforation to form a first terminal having a recessed portion, the recessed portion being formed in an upper face of the first terminal;
   shaving a bottom surface of the first semiconductor chip to expose a bottom end of the first terminal from the bottom surface of the first semiconductor chip;
   preparing a second semiconductor chip equipped with a second terminal having a structure that is the same as the first terminal; and
   stacking the first and second semiconductor chips such that the bottom end of the first terminal engages with the recessed portion in the upper face of the second terminal of the second semiconductor chip.

2. The method for manufacturing a semiconductor device according to claim 1, wherein the step of filling the conductive material is performed by subjecting the perforation to a plating operation.

3. The method for manufacturing a semiconductor device according to claim 1, wherein the step of filling the conductive material is performed by subjecting the perforation to a plating operation and the recessed portion is formed by controlling at least one of a duration and an intensity of the plating operation.

4. The method for manufacturing a semiconductor device according to claim 2, wherein the plating operation further comprises increasing a density of an applied current from a small value step by step.

5. The method for manufacturing a semiconductor device according to claim 4, wherein the plating operation further comprises increasing the density of the applied current from 0.2–0.5 $A/dm^2$ to 0.5–1 $A/dm^2$, then to 1–2 $A/dm^2$, and then to 2–3 $A/dm^2$ in four steps.

6. The method for manufacturing a semiconductor device according to claim 2, wherein the plating operation further comprises adding an additive to a plating solution a certain amount at a time during the plating operation.

7. The method for manufacturing a semiconductor device according to claim 1, wherein at least one of the first and second terminals has a T shape in cross section and the recessed portion is located at substantially a center of the upper face of the terminal having such a T shape.

8. The method for manufacturing a semiconductor device according to claim 1, wherein at least one of the first and second terminals has a circular shape in cross section perpendicular to an axis between the upper face and bottom end of the terminal.

9. The method for manufacturing a semiconductor device according to claim 8, wherein the upper face of at least one of the first and second terminals has a diameter that is two times larger than a diameter of the bottom end of the terminal.

10. The method for manufacturing a semiconductor device according to claim 1, wherein the perforation extends through a conductive pad disposed on at least one of the first and second semiconductor chips.

11. The method for manufacturing a semiconductor device according to claim 1, wherein a bottom portion of the perforation has a tapered shape and a bottom end of at least one of the first and second terminals has a tapered shape.

12. The method for manufacturing a semiconductor device according to claim 1, wherein a bottom portion of the perforation has a tapered shape, a wall of the bottom portion has a step, the bottom end of at least one of the first and second terminals has a tapered shape, and a surface of the bottom end has a step.

13. The method for manufacturing a semiconductor device according to claim 1, wherein a bottom portion of the perforation has a tapered shape, a wall of the bottom portion has a plurality of steps, a bottom end of at least one of the first and second terminals has a tapered shape, and a surface of the bottom end has a plurality of steps.

14. The method for manufacturing a semiconductor device according to claim 1 further comprising:
   a step of placing a brazing alloy on at least one of the upper face and bottom end of at least one of the first and second terminals; and
   then joining the first and second semiconductor chips to each other with the brazing alloy disposed therebetween.

15. The method for manufacturing a semiconductor device according to claim 14, wherein the brazing alloy contains at least one member selected from the group consisting of Sn, Au, Ag, In, SnAg, SnBi, SnCu, SnPb, SnAu, and SnIn.

16. The method for manufacturing a semiconductor device according to claim 1 further comprising:
   a step of placing a brazing alloy on a region of the upper face of at least one of the first and second terminals; and
   then joining the first and second semiconductor chips to each other with the brazing alloy disposed therebetween;
   wherein the region is one other than an edge of the upper face.

17. The method for manufacturing a semiconductor device according to claim 1 further comprising:
   a step of placing a brazing alloy on the recessed portion of at least one of the first and second terminals; and
   then joining the first and second semiconductor chips to each other with the brazing alloy disposed therebetween.

* * * * *

UNITED STATES PATENT AND TRADEMARK OFFICE
CERTIFICATE OF CORRECTION

PATENT NO. : 7,045,443 B2  Page 1 of 1
APPLICATION NO. : 10/744702
DATED : May 16, 2006
INVENTOR(S) : Kuniyasu Matsui It is certified that error appears in the above-identified patent and that said Letters Patent is hereby corrected as shown below:

| | |
|---|---|
| Title Page Item (56), pg. 2, second column: | Under FOREIGN PATENT DOCUMENTS, line 1, "EP 1 110 298" should be --EP 1 100 298-- |
| Column 4, Line 30: | "or-second" should be --or second-- |
| Column 5, Line 6: | after "chips" insert --to-- |
| Column 5, line 23: | before "each" insert -- to -- |
| Column 5, Line 36: | after "chips" insert --to-- |
| Column 6, Line 12: | "2A-2c" should be --2A-2C-- |
| Column 6, Line 41: | "1(a) to 1(e)" should be --1A to 1E-- |
| Column 8, Line 14: | after "terminals" insert --to-- |
| Column 8, Line 34: | "FIG" should be --FIGS.-- |
| Column 11, Line 43: | after "aligned" insert --with-- |

Signed and Sealed this

Eighth Day of May, 2007

JON W. DUDAS
*Director of the United States Patent and Trademark Office*